(12) United States Patent
Behzad

(10) Patent No.: US 6,972,610 B2
(45) Date of Patent: *Dec. 6, 2005

(54) HIGH LINEARITY PASSIVE MIXER AND ASSOCIATED LO BUFFER

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 10/990,671

(22) Filed: Nov. 17, 2004

(65) Prior Publication Data

US 2005/0073352 A1    Apr. 7, 2005

Related U.S. Application Data

(63) Continuation of application No. 10/382,811, filed on Mar. 6, 2003.

(51) Int. Cl.[7] ............................. H04B 1/28; G06G 7/16
(52) U.S. Cl. ..................... 327/359; 327/355; 327/357; 455/333; 455/326
(58) Field of Search ............................... 327/355–361; 455/326, 333

(56) References Cited

U.S. PATENT DOCUMENTS

| 4,947,062 | A |   | 8/1990  | Weiner et al. |         |
|-----------|---|---|---------|---------------|---------|
| 5,361,409 | A |   | 11/1994 | Vice          |         |
| 5,513,390 | A |   | 4/1996  | Vice          |         |
| 6,057,714 | A | * | 5/2000  | Andrys et al. | 327/105 |
| 6,133,793 | A |   | 10/2000 | Lau et al.    |         |
| 6,194,947 | B1|   | 2/2001  | Lee et al.    |         |
| 6,380,777 | B1|   | 4/2002  | Degardin et al.|        |
| 6,529,721 | B1|   | 3/2003  | Tiller        |         |
| 6,608,527 | B2|   | 8/2003  | Moloudi et al.|         |
| 6,781,445 | B2| * | 8/2004  | Feldman       | 327/563 |
| 2004/0174202 | A1| * | 9/2004 | Behzad       | 327/359 |
| 2004/0259519 | A1| * | 12/2004 | Su          | 455/326 |
| 2005/0088204 | A1|   | 4/2005 | Behzad       |         |

FOREIGN PATENT DOCUMENTS

EP        0 726 646 A       8/1996

OTHER PUBLICATIONS

Cho Y et al., "A New CMOS Passive Mixer with High Linearity," Extended Abstracts of the International Conference on Solid State Devices and Materials, Japan Society of Applied Physics, Tokyo, JA, vol. 2001, Sep. 26, 2001, pp. 400-401, XP 001074832.

Muraguchi M et al., "A 1.9 Ghz-band Ultra Low Power Consumption Amplifier Chip Set for Personal Communications," Microwave and Millimeter-Wave Monolithic Curcuits Symposium, 1995. Digest of Papers., IEEE 1995 Orlando, FL May 15-16, 1995, New York, NY May 15, 1995, pp. 145-158, XP 010148470, ISBN: 0-7803-2590-7.

(Continued)

Primary Examiner—Dinh T. Le
(74) Attorney, Agent, or Firm—Christie, Parker & Hale, LLP

(57) ABSTRACT

An RF communications system includes a transmit node for transmitting an RF information signal and a receive node for receiving the transmitted RF information signal. The receive node includes a passive mixer coupled to an amplifier for producing an IF or baseband differential mixer output signal as a function of a LO drive signal. The passive mixer having a first plurality of transistors of a first polarity type arranged in a ring configuration and a second plurality of transistors of a second polarity type, wherein each of second plurality of transistors is coupled to one of the first plurality of transistors.

18 Claims, 9 Drawing Sheets

OTHER PUBLICATIONS

Keng Leong Fong et al, "A 2.4 GHz Monolithic Mixer for Wireless LAN Applications," Custom Integrated Circuits Conference, 1997, Proceedings of the IEEE 1997 Santa Clara, CA, May 5-8, 1997, New York, NY, IEEE, US, May 5, 1997, pp. 185-188, XP 010235288, ISBN: 0-7803-3669-0.

Jenshan Lin et al., "3V GSM base station RE Receivers Using 0.25/spl mu/m BiCMOS," IEEE-International Solid-State Circuit Conference, Feb. 5, 2001, pp. 416, 417 and 471, XP 010536327.

EP Search Report, European Patent Application No. 04004414.1, Sep. 27, 2004.

Flaviis et al., *X-Band Doubly Balanced Resistive FET Mixer with Very Low Intermodulation*, Short Papers, IEEE Transactions on Microwave Theory and Techniques, Feb. 1995, pp. 457-460, vol. 43, No. 2.

* cited by examiner

HIGH LINEARITY PASSIVE MIXER AND ASSOCIATED LO BUFFER

CROSS-REFERENCE TO RELATED APPLICATION(S)

This application is a continuation of U.S. patent application Ser. No. 10/382,811, filed Mar. 6, 2003, and entitled "High Linearity Passive Mixer and Associate LO Buffer," the entire contents of which are hereby incorporated by reference.

BACKGROUND

This invention generally relates to communication systems and more particularly relates to high linearity intermediate frequency stages for RF communication systems.

Communication networks such as wireless networks for transmitting data and audio information are increasingly in use. Typically, transceivers for wireless nodes are superheterodyne radio frequency (RF) receivers that mix the received signal with a local oscillator (LO) signal to downconvert the received signal (e.g., the RF signal) to one or more intermediate frequency (IF) signals. The IF signals have fixed, or at least restricted, frequencies which allow the IF signals to be more easily filtered, amplified, and otherwise processed.

Mixers are typically used to translate the received RF signal in frequency by combining the received signal with a Local Oscillator (LO) signal to create an output signal at either the sum ($f_{RF}+f_{LO}$) or the difference ($f_{RF}-f_{LO}$ or $f_{LO}-f_{RF}$) of the input signals. Mixers may be either passive or active. Passive mixers are based on un-biased semiconductors. Passive mixer circuits generally exhibit a low noise figure and are highly linear over a relatively wide dynamic range.

However, passive mixer circuits generally require a relatively high power local oscillator drive signal as well as low noise IF amplification to compensate for relatively high insertion loss. For example, most passive mixers have a conversion loss on the order of 6 dB, a noise figure on the order of 6 dB, and an intercept point dependent on the amount of LO drive provided which is typically between 0 to +17 dBm for a passive mixer.

SUMMARY OF THE INVENTION

In one aspect of the present invention an RF communications circuit includes a first plurality of transistors of a first polarity type arranged in a ring configuration and a second plurality of transistors of a second polarity type. In this embodiment, a source electrode of each of the second plurality of transistors is coupled to a drain electrode of a different one of the first plurality of transistors and a drain electrode of each of the second plurality of transistors is coupled to a source electrode of a different one of the first plurality of transistors. The first and second plurality of transistors produce a mixer output signal and a complementary mixer output signal having a frequency which is a function of the frequency of an input signal and the frequency of the drive signal.

In another aspect of the present invention a RF communication circuit includes a first plurality of transistors of a first polarity type arranged in a ring configuration and a second plurality of transistors of a second polarity type. Each of the second plurality of transistors is coupled to a unique one of the first plurality of transistors. In addition an inductively loaded LO buffer for producing differential LO drive signals drives the first and second plurality of transistors In operation the first and second plurality of transistors produces an IF differential mixer output signal and a complementary mixer output signal.

In a further aspect of the present invention a RF communication circuit includes a differential pair of inductively loaded LO buffer transistors coupled between a positive voltage source and ground for producing a differential LO drive signal for driving a mixer.

In a still further aspect of the present invention an RF communications system includes a transmit node for transmitting an RF information signal and a receive node for receiving the transmitted RF information signal. The receive node includes a passive mixer coupled to an amplifier for producing an IF differential mixer output signal as a function of a LO drive signal. The passive mixer includes a first plurality of transistors of a first polarity type arranged in a ring configuration and a second plurality of transistors of a second polarity type, wherein each of the second plurality of transistors is coupled to a unique one of the first plurality of transistors.

BRIEF DESCRIPTION OF THE DRAWINGS

The present invention will become better understood with regard to the following description, appended claims, and accompanying drawings, in which:

DETAILED DESCRIPTION OF THE INVENTION

Figure 1:
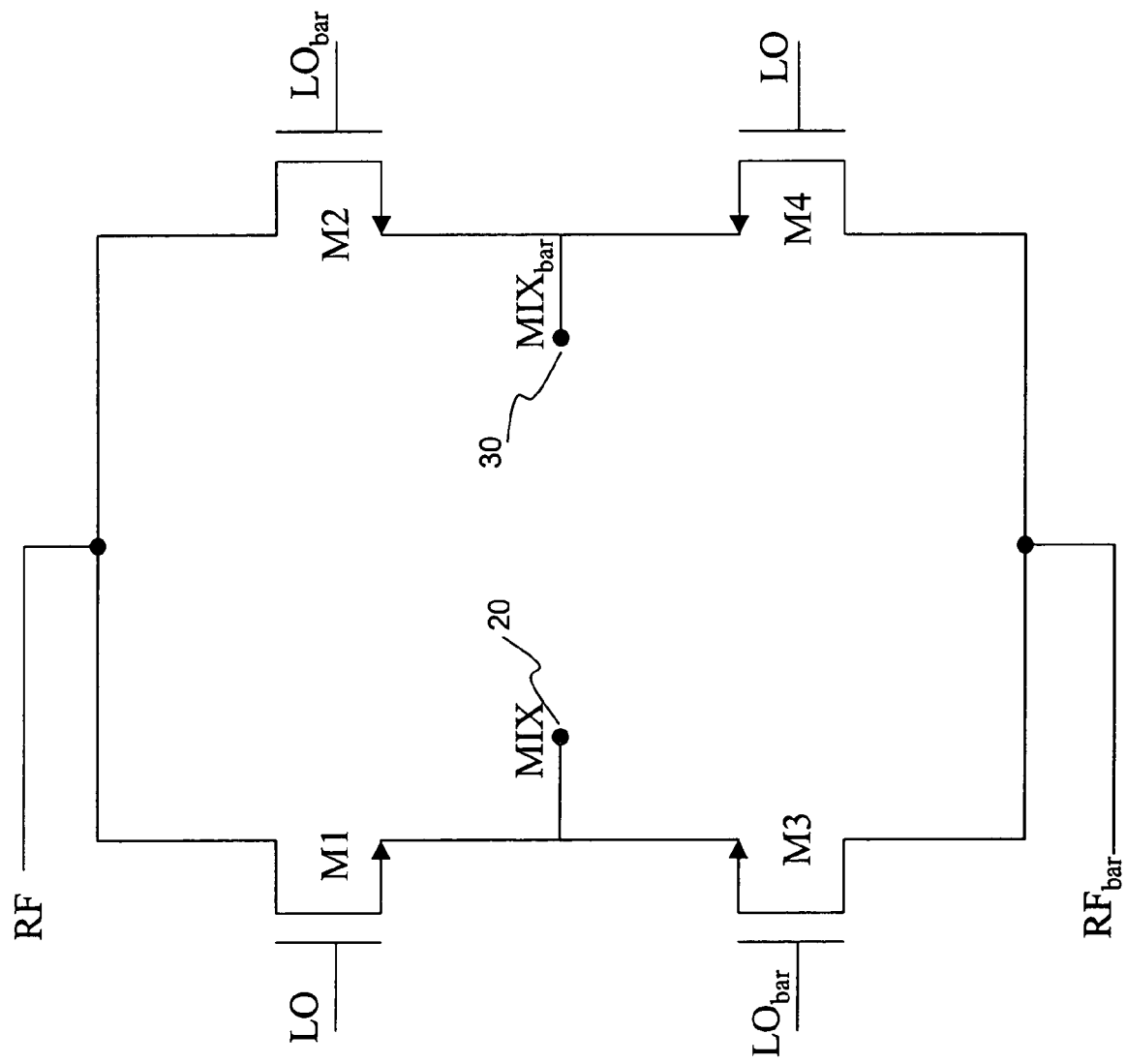
FIG. 1 is a simplified schematic diagram of a conventional passive mixer.

An exemplary embodiment of the present invention includes a passive mixer in a high linearity IF stage for an RF communication system. FIG. 1 illustrates a simplified circuit diagram of a doubly balanced passive mixer having four FETs M1–M4, arranged in a ring configuration. During passive mixing the drain source bias $V_{DS}$ of FETs M1–m4 is approximately equal to zero so that each of the devices operate in the linear region and the channel resistance (i.e. the resistance between the source and drain) is of the devices is modulated with a large LO drive signal.

In this embodiment the sources of M3 and M4 are coupled to the sources of M1 and M2 respectively to form an IF mixer output 20 and a complementary IF mixer output 30. In addition, the drains of M1 and M2 are coupled to the RF input while the drains of M3 and M4 are coupled to the complement of the RF input (i.e. RF input shifted by 180 degrees). In this embodiment the resistance of the drain-source channels of FETs M1–M4 are controlled by the instantaneous voltage applied to their gate electrodes by the LO drive signal and its complement (i.e. $LO_{bar}$).

For example, during the first (positive) half of a sinusoidal LO cycle, the voltage applied to the gate electrodes of FETs M1 and M4 is increased, causing the drain-to-source resistances of FETs M1 and M4 to become very low. Therefore, the IF mixer output 20 is coupled to the RF input via FET M1 and the complement of the RF input is coupled to the complement of the IF mixer output 30 via M4 during the positive half of a LO drive signal cycle.

At the same time, the voltage applied to the gate electrodes of the other pair of FETS, M2 and M3, is decreased (due to the 180 degree phase shift of the LO signal component applied to those gate electrodes), driving FETs M2 and M3 into pinch-off. This causes the source-to-drain channels of FETs M2 and M3 to appear substantially as open-circuits during the positive half of a LO drive signal cycle.

The opposite occurs during the second or negative half of the sinusoidal LO drive signal cycle. That is, the gate voltage of FETs M2 and M3 is increased by the complement of the LO signal to produce low drain-to-source resistances for FETs M2 and M3, while the drain-to-source resistances of FETs M1 and M4 are driven very high by the instantaneous decrease in the gate voltage of FETs M1 and M4. Thus, the RF signal is coupled through FET M2 to the complementary IF mixer output 30 and the complement of the RF signal is coupled through FET M3 to the IF mixer output 20 during the second or negative half of the sinusoidal LO drive signal cycle.

In operation, therefore, the outputs 20 and 30 of the passive mixer switch between the RF input and the complement of the RF input (i.e. essentially between +/−1) at the LO frequency. The switching action of FETs M1–M4 in the time domain provides the desired frequency translation in the frequency domain. Therefore, the mixer converts the differential RF signal into a baseband signal or an intermediate frequency (IF) signal having a pair of components 180 degrees out of phase with each other.

Figure 2:
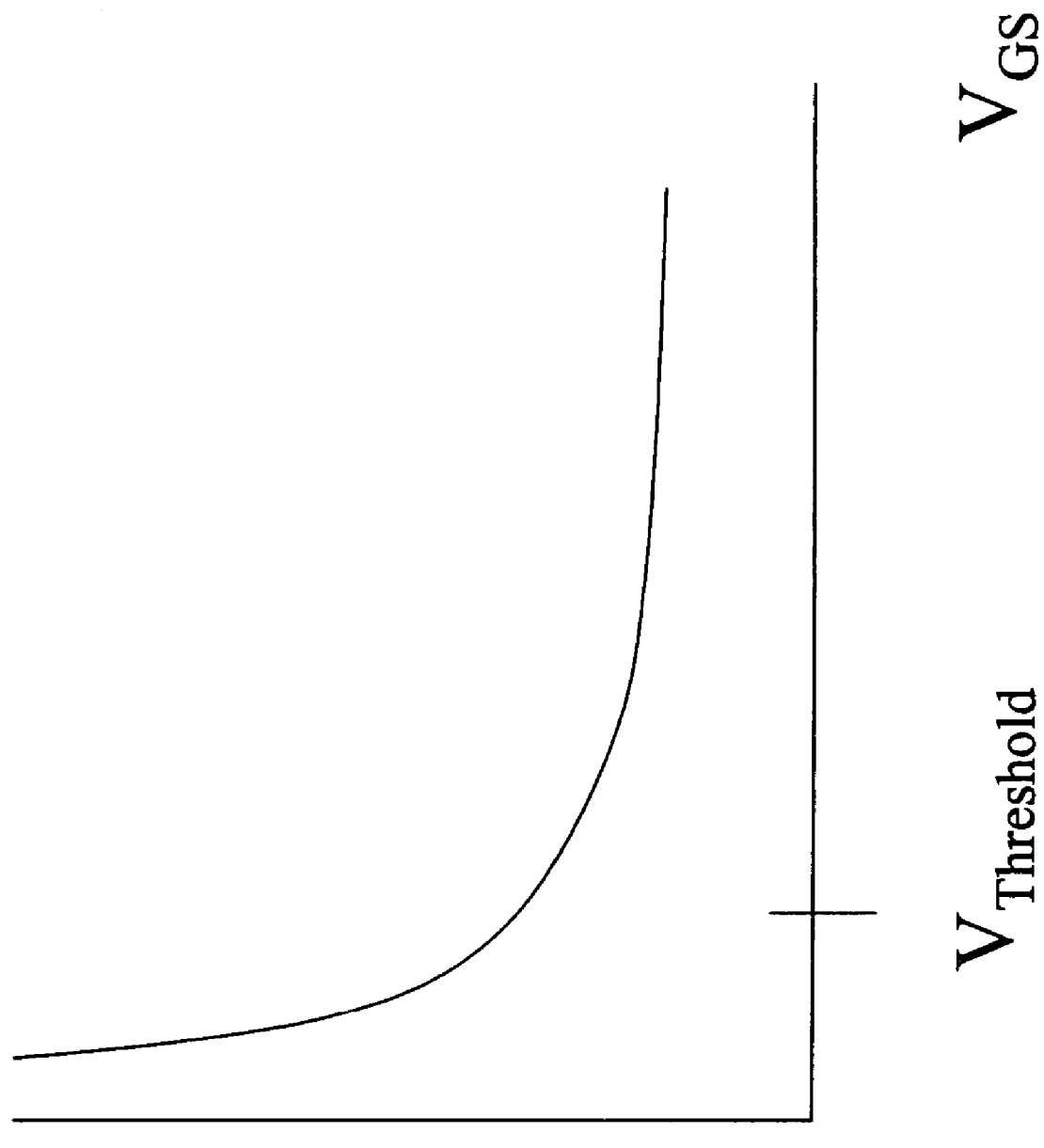
FIG. 2 is a graphical illustration of the on resistance of a Metal-Oxide-Semiconductor (MOS) Field Effect Transistor (FET) as a function of the gate source voltage.

However, FETs have a non-linear switch-on resistance as a function of gate-source voltage ($V_{GS}$) as illustrated in FIG. 2. In addition, the sinusoidal LO drive signal and its complement have relatively small drive voltages for a significant part of their period. As a result the RF input signal may vary the switch-on resistance of FETs M1–M4 during the periods when the amplitude of the LO drive voltage is at a low level, thereby introducing distortion and insertion loss into the mixer output signals.

Figure 3:
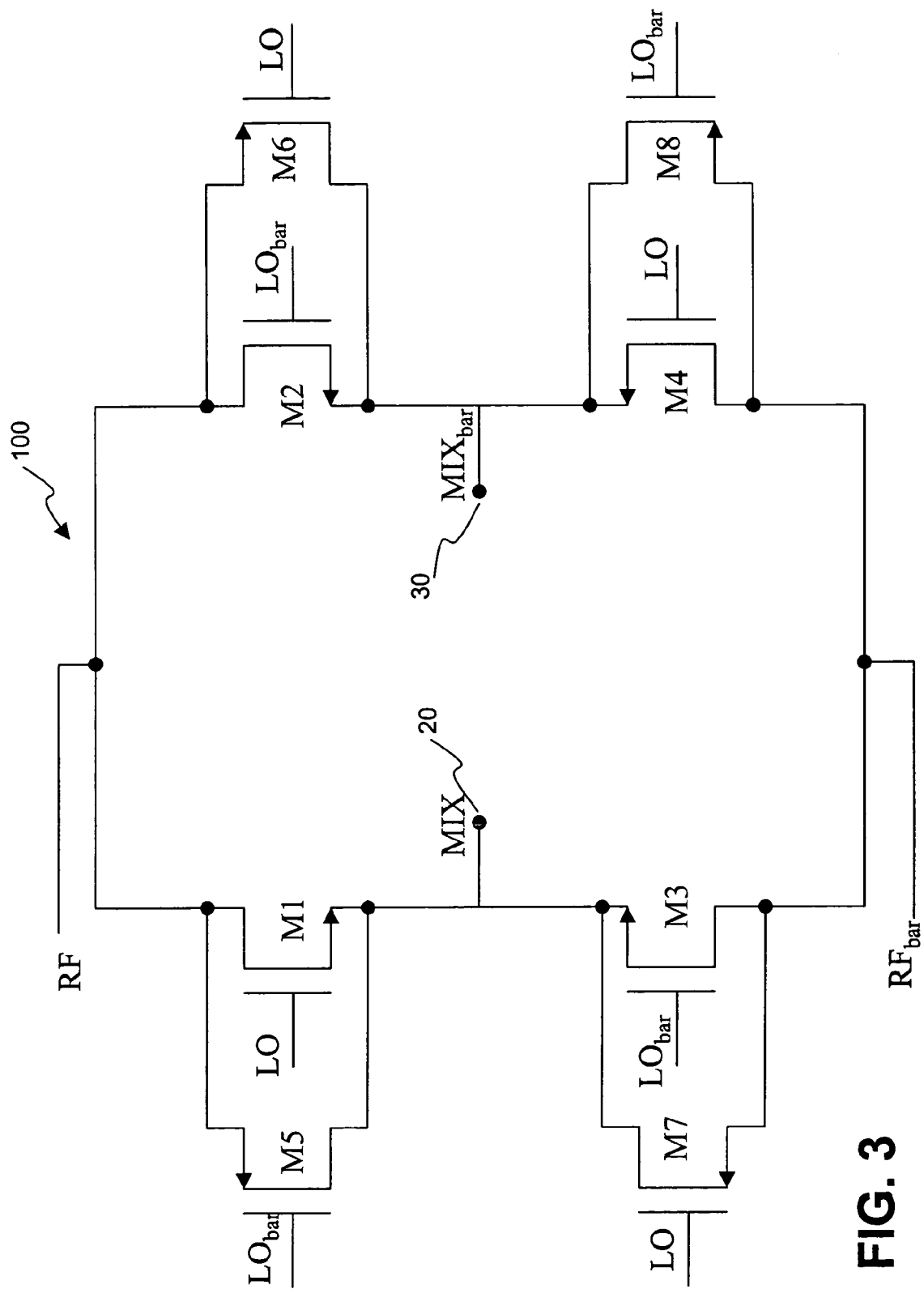
FIG. 3 is a simplified schematic diagram of a passive mixer having complementary PMOS transistors coupled to NMOS transistors in accordance with an exemplary embodiment of the present invention.

Therefore, an exemplary passive mixer 100, in accordance with the present invention, illustrated in FIG. 3, comprises complementary PMOS FETs M5–M8 coupled to the NMOS FETS M1–M4 respectively to reduce the resistance and loss associated with the switching transistors M1–M4. In the described exemplary embodiment the source electrode of each of the PMOS FETs M5–M8 is coupled to a drain electrode of a corresponding NMOS FET, M1–M4 respectively, and a drain electrode of each of the PMOS FETs M5–M8 is coupled to a source electrode of a corresponding NMOS FET, M1–M4 respectively.

In the described exemplary mixer 100 PMOS FETs M5 and M8 are driven by the complement of the LO drive signal and PMOS FETs M6 and M7 are driven by the LO drive signal. Therefore, during the first (positive) half of a sinusoidal LO drive signal cycle, the voltage applied to the gate electrodes of NMOS FETs M1 and M4 is increased, as is the negative voltage applied to the gate electrodes of PMOS FETs M5 and M8, reducing the drain-to-source resistances of FETs M1, M4, M5 and M8. The described exemplary embodiment therefore provides low impedance switches with on resistances equal to the parallel resistance of M1 and M5 and M4 and M8 during the positive half of a LO drive signal cycle. In this instance MOSFETs M1 and M5 couple the RF signal to the IF mixer output 20 and MOSFETs M4 and M8 couple the complement of the RF signal to the complement of the IF mixer output 30.

At the same time, the voltage applied to the gate electrodes of the other pair of NMOS FETs M2 and M3 and PMOS FETs M6 and M7 is decreased (due to the 180 degree phase shift of the LO drive signal component applied to those gate electrodes), driving FETs M2, M3, M6 and M7 into pinch-off. This causes the source-to-drain channels of NMOS FETs M2 and M3 and PMOS FETs M6 and M7 to appear substantially as open-circuits during the positive half of a LO drive signal cycle.

The opposite again occurs during the second or negative half of the sinusoidal LO drive signal cycle. That is, the gate voltages of NMOS FETs M2 and M3 are increased by the complement of the LO drive signal to produce a low drain-to-source resistance for FETs M2 and M3, while the drain-to-source resistances of FETs M1 and M4 are driven very high by the instantaneous decrease in the gate voltage of FETs M1 and M4. Similarly, the gate voltage of PMOS FETs M6 and M7 are negative producing a low drain-to-source resistance for PMOS FETs M6 and M7, while the drain-to-source resistances of PMOS FETs M5 and M8 are driven very high by the instantaneous decrease in the gate voltage of PMOS FETs M5 and M8.

Therefore, the described exemplary embodiment provides low impedance switches whose on resistances are equal to the parallel impedance of M2 and M6 and M3 and M7 during the second or negative half of the sinusoidal LO drive signal cycle. In this embodiment the low impedance MOSFETs M2 and M6 couple the RF signal input to the complementary IF mixer output 30 and MOSFETs M3 and M7 couple the complement of the RF signal to the IF mixer output 20 respectively during the second or negative half of the sinusoidal LO signal cycle.

Thus the outputs 20 and 30 of the described exemplary passive mixer are again switched between the RF input and the complement of the RF input (i.e. essentially between +/−1) at the LO frequency. The switching action of FETs M1–M8 in the time domain provides the desired frequency translation in the frequency domain. Therefore, the described exemplary passive mixer converts the differential RF signal into a baseband signal or an intermediate frequency (IF) signal having a pair of components 180 degrees out of phase with each other.

Figure 4:
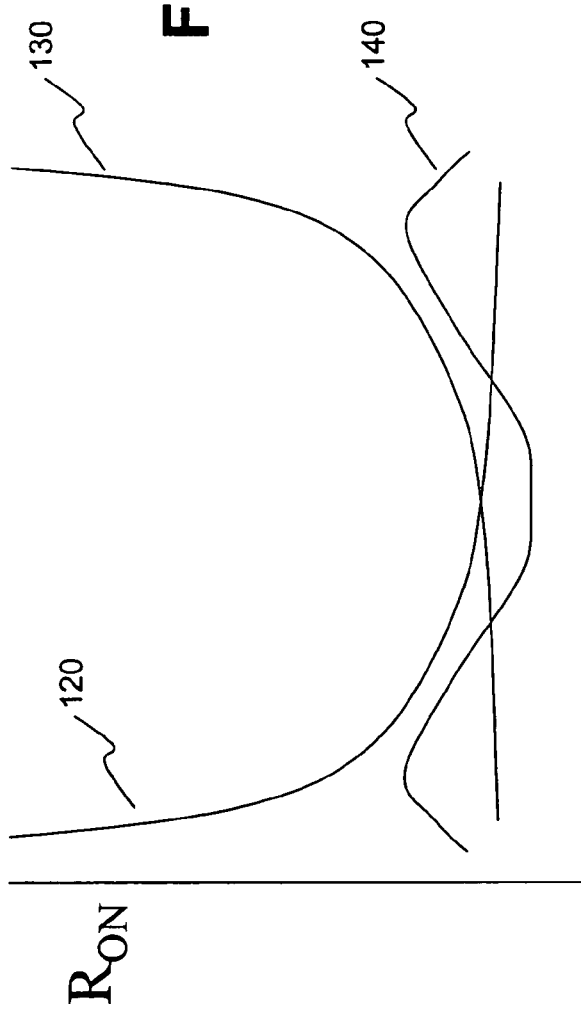
FIG. 4 is a graphical illustration of the on resistance of an NMOS transistor, a PMOS transistor and the parallel resistance of the NMOS and PMOS transistors as a function of the absolute value of the gate source voltage.

In practice the complementary PMOS devices, M5–M8, reduce the average on resistance and associated loss of the NMOS devices, M1–M4, for a sinusoidal LO drive signal. For example, FIG. 4 graphically illustrates the general dependence of the on resistance of an NMOS FET 120 and a PMOS FET 130 as a function of the absolute value of the gate-source voltage. The opposite polarity of the devices is such that the on resistance of a PMOS FET is relatively low when the on resistance of an NMOS FET is relatively high and vice versa. Therefore, the parallel combination 140 of the on resistance of a PMOS FET and NMOS FET, on average, is significantly lower and more linear over a cycle of a sinusoidal drive signal than the on resistance of the NMOS or PMOS devices alone.

Figure 5:
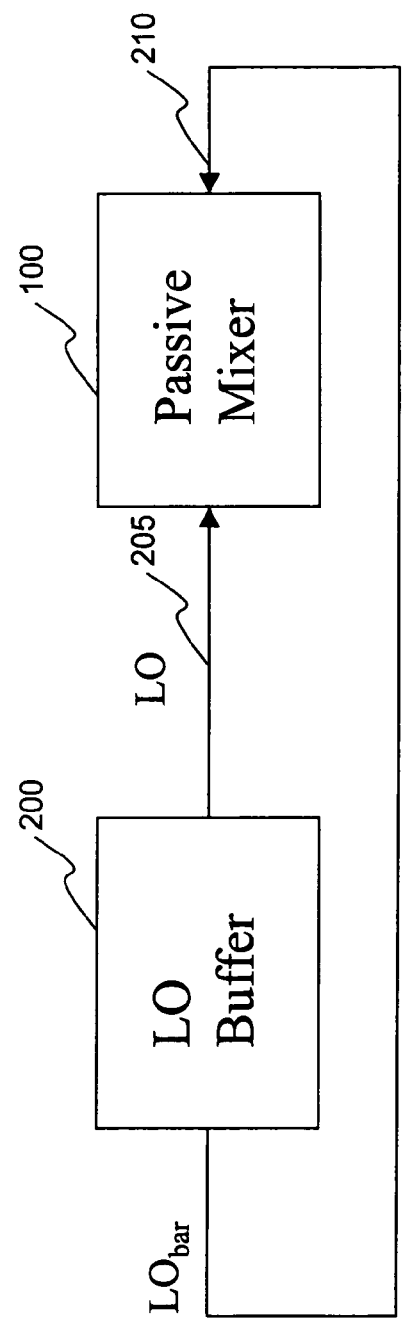
FIG. 5 is a simplified block diagram of the passive mixer of FIG. 3 coupled to an inductively loaded high swing LO buffer in accordance with an exemplary embodiment of the present invention.

However, the mobility of PMOS FETs tends to be significantly less than the mobility of a comparably sized NMOS device. Therefore, the aspect ratio of the PMOS devices M5–M8 of the described exemplary mixer are about 3–5 times larger than the aspect ratio of the corresponding NMOS devices M1–M4 to provide an optimum match between the on resistance of the PMOS and NMOS devices. The capacitance of the complementary PMOS devices therefore tends to be relatively high requiring a relatively high power LO drive signal for distortion free mixing. Therefore, referring to FIG. 5, an exemplary embodiment of the present invention further comprises a high swing, inductively loaded LO buffer 200 that provides high power drive signals 205 and 210 for optimum performance of the described exemplary passive mixer 100.

Figure 6:
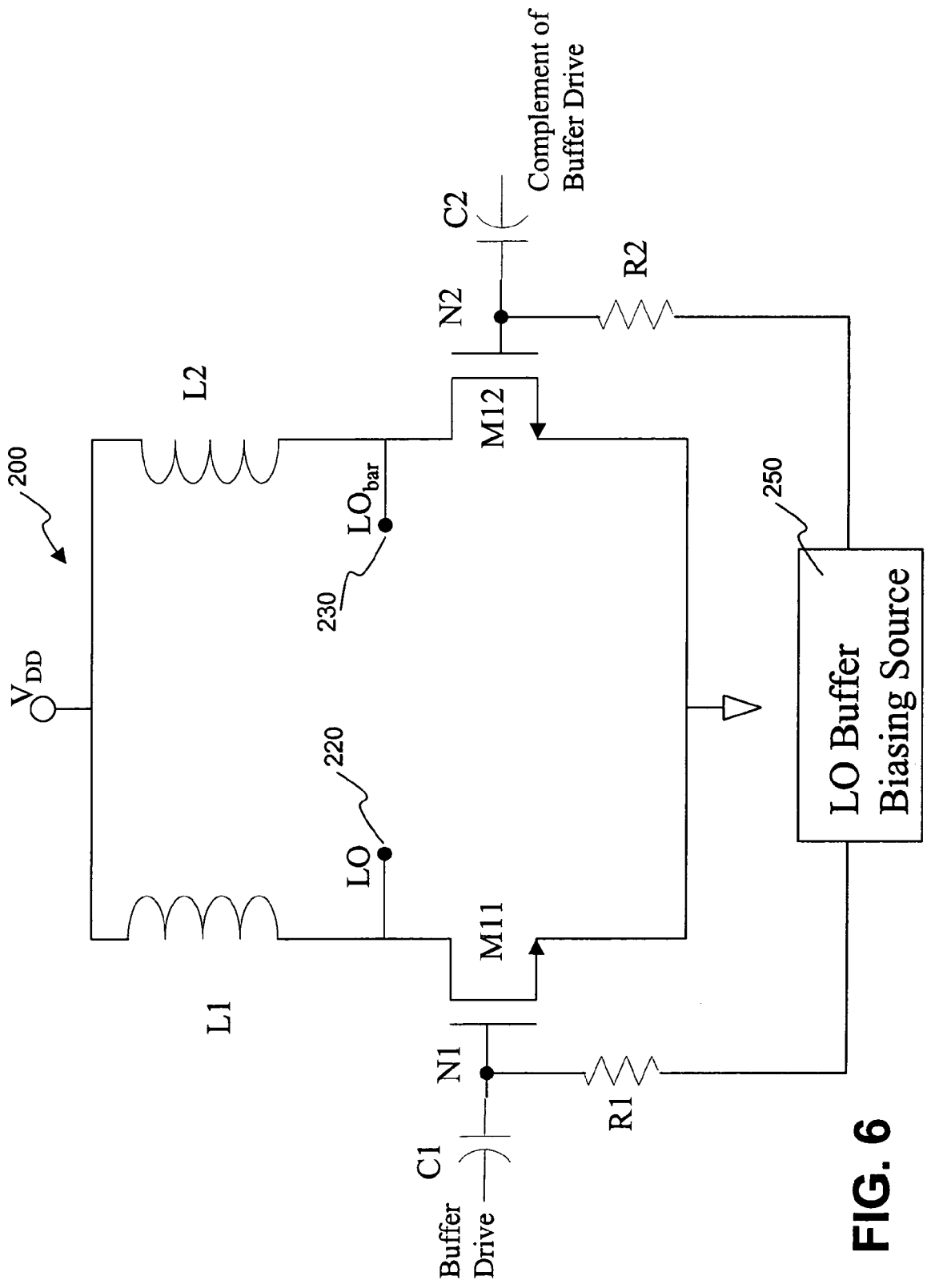
FIG. 6 is a simplified schematic diagram of the inductively loaded high swing LO buffer of FIG. 5 in accordance with an exemplary embodiment of the present invention.

For example, FIG. 6 is a simplified schematic diagram of an exemplary LO buffer 200 for driving the described exemplary passive mixer. In this embodiment, a differential pair of inductively loaded NMOS FETs M11 and M12 are coupled between a positive voltage source $V_{DD}$ and ground. In operation, NMOS FETs M11 and M12 are driven by a complementary differential buffer drive signal such that when the drive signal for FET M11 is high the drive signal for FET M12 is low. In operation, if the buffer drive signal is high, NMOS transistor M11 is on and LO buffer output 220 is low. In addition, when the buffer drive signal is high the complement of the buffer drive signal is low and complementary LO buffer output 230 switches high (i.e. coupled to the positive voltage source $V_{DD}$) through inductive load L2.

Similarly, if the buffer drive signal is low, NMOS transistor M11 is off, and the LO buffer output 220 switches high (i.e. coupled to the positive voltage source $V_{DD}$) through the inductive load L1. In addition, in this instance the complement of the buffer drive signal is high switching on NMOS FET m12 thereby coupling the complementary LO buffer output 230 to ground (i.e. switching to low).

Advantageously, the use of inductive loads L1 and L2 tunes out the capacitance of the buffer and reduces the required power consumption of the buffers. However, in the described exemplary embodiment, the LO buffer is coupled between a positive voltage source and ground and does not include a tail end bias current coupled to the sources of the NMOS FETs M11 and M12. Therefore, in the described exemplary embodiment the driver for the LO buffer may include an LO buffer bias circuit to apply a predetermined bias voltage to the gates of NMOS FETS M11 and M12. In an exemplary embodiment the LO buffer bias circuit comprises AC coupling capacitors C1 and C2, drive resistors R1 and R2 and an LO buffer biasing source 250 adapted to provide the desired voltage at nodes N1 and N2.

Figure 7:
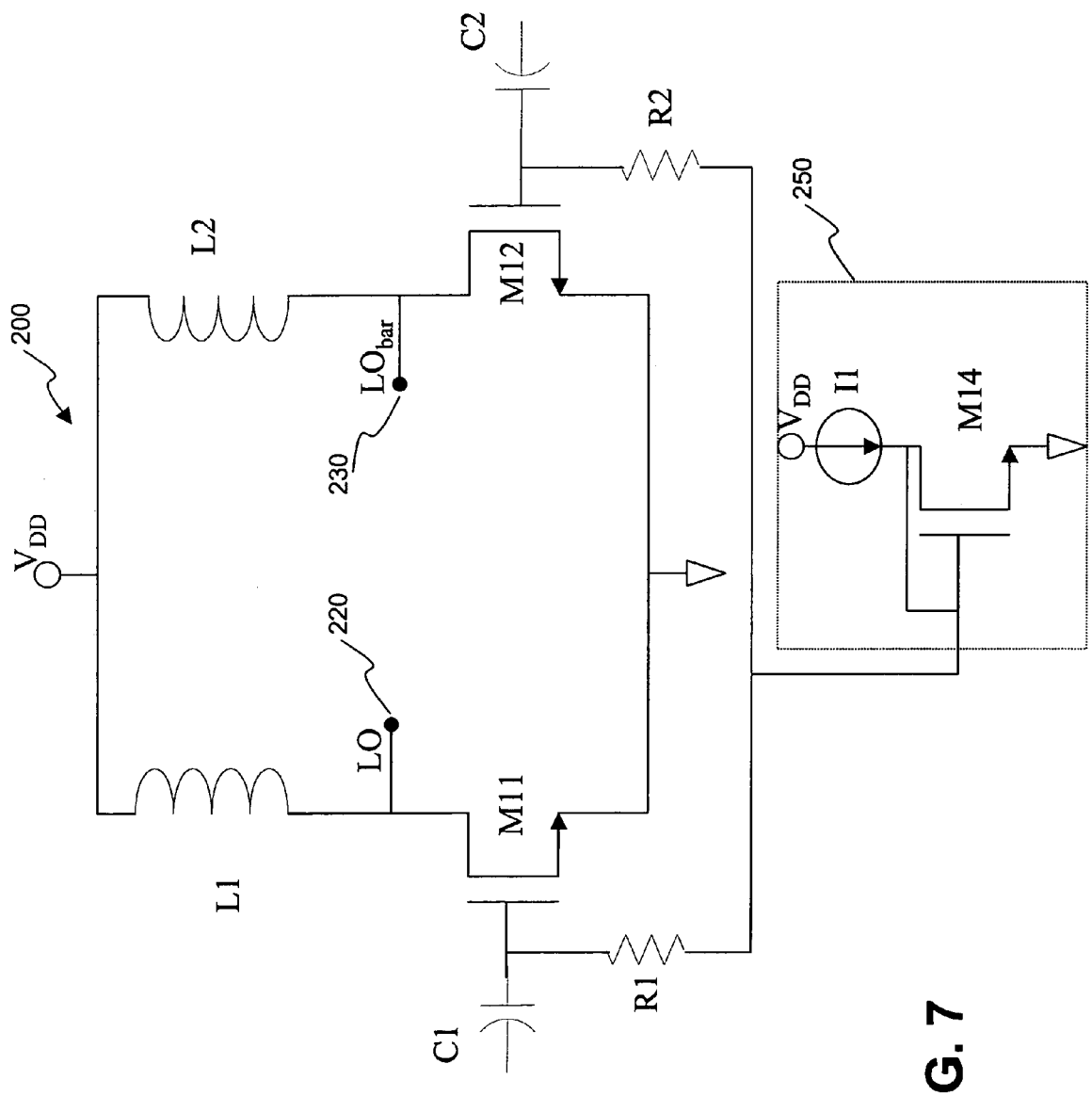
FIG. 7 is a simplified schematic diagram of the inductively loaded high swing LO buffer of FIG. 6 having a bias circuit coupled to inputs of the LO buffer in accordance with an exemplary embodiment of the present invention.

For example referring to FIG. 7, the LO buffer biasing source 250 may comprise a MOS transistor M14 having a gate coupled to R1 and R2, the gate and source coupled to a current source I1 and the drain coupled to ground. In one embodiment the aspect ratio of NMOS FETs M11 and M12 may be substantially equal. In addition, in the described exemplary embodiment the aspect ratio of NMOS FETs M11 and M12 is K times larger than the aspect ratio of MOS transistor M14, where K is a constant greater than unity. The described exemplary biasing circuit therefore performs as a current mirror where the bias current that drives FETs M11 and M12 is approximately K times larger than the level of current source I1.

In the described exemplary Lo buffer the inductive loads L1 and L2 on the output side of the NMOS FETs M11 and M12 may be used to tune out the capacitance associated with the PMOS FETs M5–M8 of the passive mixer (see FIG. 3). Therefore, the power consumption of the described exemplary buffer may also be reduced.

In the described exemplary embodiment, the differential LO waveforms output by the LO buffer 200 are, by way of example, sine waves delivered from a relatively low output impedance buffer. The described exemplary inductively loaded differential transistor pair M11 and M12 output a very high swing LO buffer signal 220 and complementary LO buffer output signal 230. In an exemplary embodiment the LO sine waves output by the LO buffer have nearly rail-rail excursions with the minimum sine wave amplitude limited only by the drain source voltage of NMOS transistors M11 and M12 (i.e. ground+$V_{DS}$).

However, the maximum excursion of the differential LO sine waves output by the inductively loaded transistors may exceed $V_{DD}$ and may therefore breakdown the FET devices M1–M8 of the passive mixer (see FIG. 3). In addition, the common mode voltage of the LO buffer output signals, LO and the complement of LO 220 and 230, is approximately equal to $V_{DD}$ which is higher than the optimum drive level for the PMOS FETs M5–M8 of the passive mixer.

Figure 8:
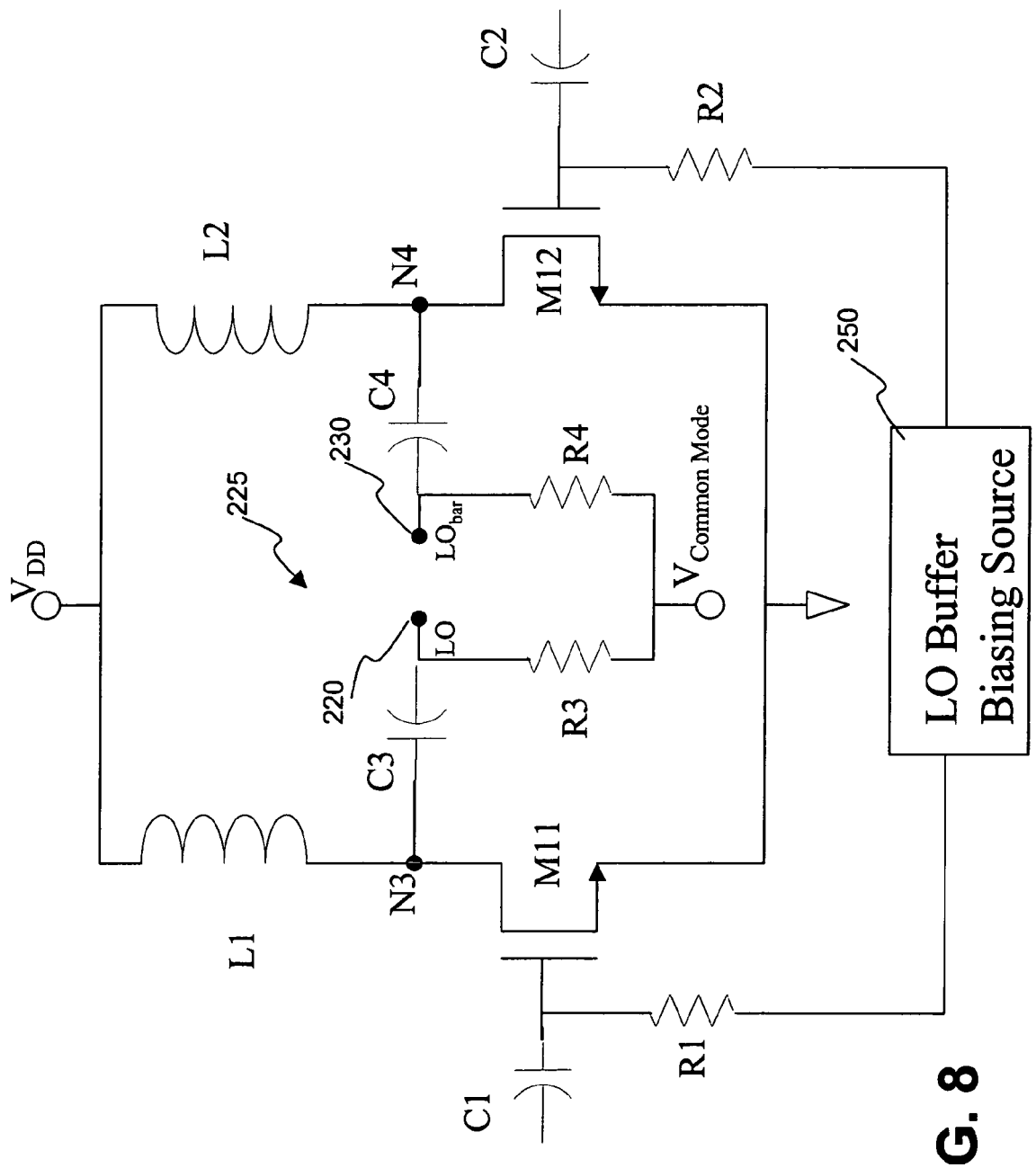
FIG. 8 is a simplified schematic diagram of the inductively loaded high swing LO buffer of FIG. 5 wherein the outputs of the LO buffer are AC coupled in accordance with an exemplary embodiment of the present invention.

Therefore, referring to the simplified circuit diagram of FIG. 8, an exemplary LO buffer 200 may further comprise an LO buffer voltage limiter 225 coupled to the LO buffer outputs 220 and 230 to limit the common mode voltage of the buffer output signals. In an exemplary embodiment, the voltage limiter may comprise AC coupling capacitors C3 and C4 on the LO buffer 220 and complementary LO buffer 230 outputs along with biasing resistors R1 and R2 which are biased to a predetermined voltage, i.e. $V_{Common\ Mode}$.

In this embodiment, the LO buffer 220 and complementary LO buffer 230 outputs are sinusoidal signals with a common mode voltage that may be set to a desired level. For example, in one embodiment the common mode output of the LO buffers may be set at approximately $V_{DD}/2$ to provide the optimum gate-source drive levels for both the NMOS M1–M4 and PMOS M5–M8 devices of the passive mixer 100 (see FIG. 3).

In operation, however nodes N3 and N4 of the LO buffer may still experience inductive load swings above $V_{DD}$. These relatively high voltage levels may stress the gate to drain junction of NMOS FETs, M11 and M12, compromising the reliability of these devices. In addition, shunt capacitors C3 and C4 on the outputs of the LO buffer create a capacitive voltage divider with the capacitive FETS M1–M8 of the passive mixer. The capacitive voltage divider may significantly reduce the amplitude of the mixer drive signals for small ratios of the shunt capacitors C3 and C4 to the load capacitance of the FETs of the passive mixer.

Figure 9:
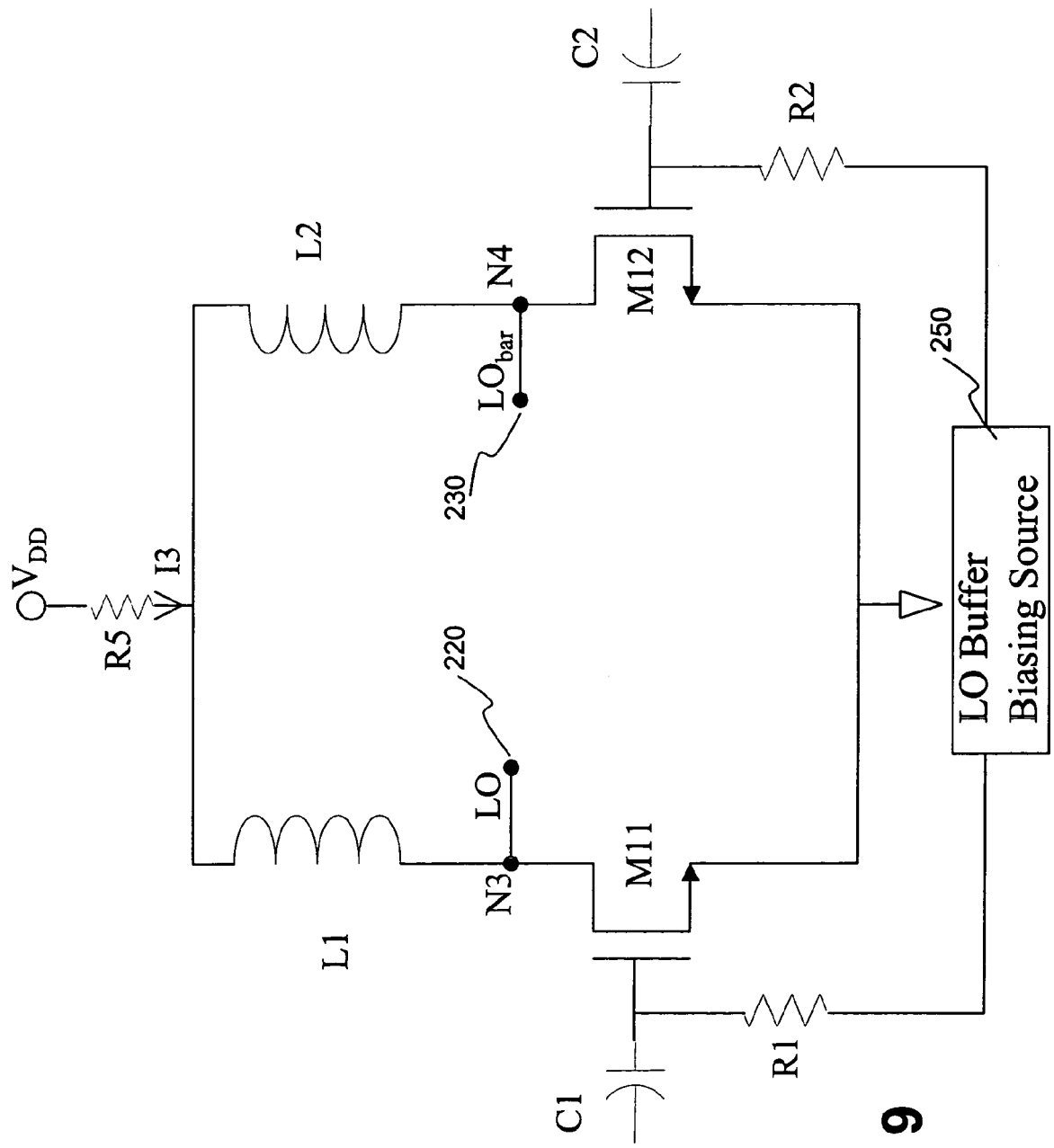
FIG. 9 is a simplified schematic diagram of the inductively loaded high swing LO buffer of FIG. 5 having a resistor coupled between a positive voltage source and the inductive loads to limit the common mode voltage of the outputs of the LO buffer in accordance with an exemplary embodiment of the present invention.

Therefore, referring to FIG. 9, an exemplary LO buffer may include a load, such as for example, a limiting resistor R5, coupled between the positive voltage source $V_{DD}$ and the inductive loads L1 and L2 to limit the common mode voltage of the LO buffer output signals. In this embodiment, the resistor R5 creates a voltage drop across the resistor equal to the product of the current I3 flowing through R5 and the resistive value of R5 (i.e. an IR drop). Therefore, assuming that inductors L1 and L2 are ideal, the common mode voltage at nodes N3 and N4 is approximately equal to $V_{DD}-I_3R5$. Accordingly, the reliability of NMOS device M11 and M12 may be improved by adjusting the value of R5 as can the common mode drive level of FETs M1–M8 of the described exemplary passive mixer.

Figure 10:
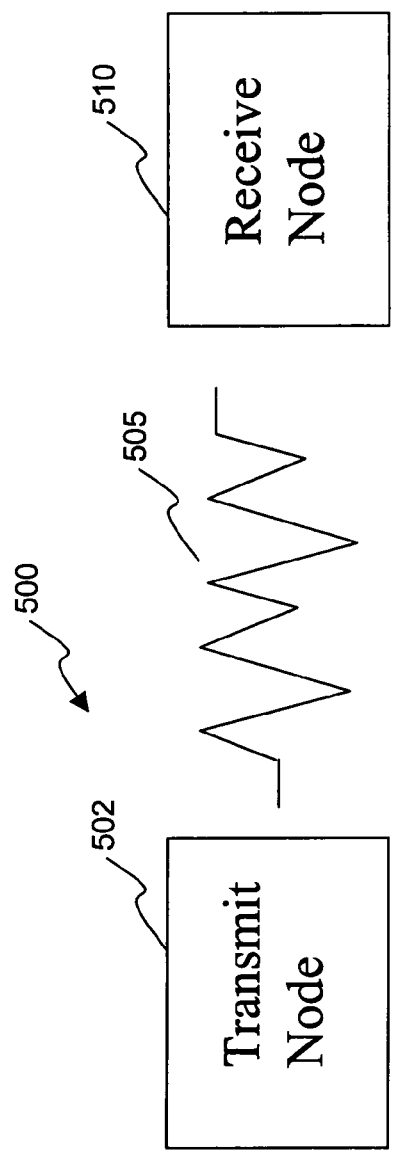
FIG. 10 is a simplified block diagram of an RF communications system having a transmit node and a receive node.

In addition, R5 will consume less on chip die space than shunt capacitors C3 and C4 (see FIG. 8) and eliminate the signal loss resulting from the capacitive voltage divider created by the shunt capacitors. One of skill in the art will appreciate that a capacitor may be coupled in parallel with resistor R5 between the positive voltage source and load FIG. 10 illustrates the integration of the described exemplary passive mixer 100 into an exemplary communication system. The illustrated communications system 500 comprises a transmit node 502 for transmitting a radio frequency information signal 505 and a receive node 510 for receiving and processing the transmitted RF information signal.

Figure 11:
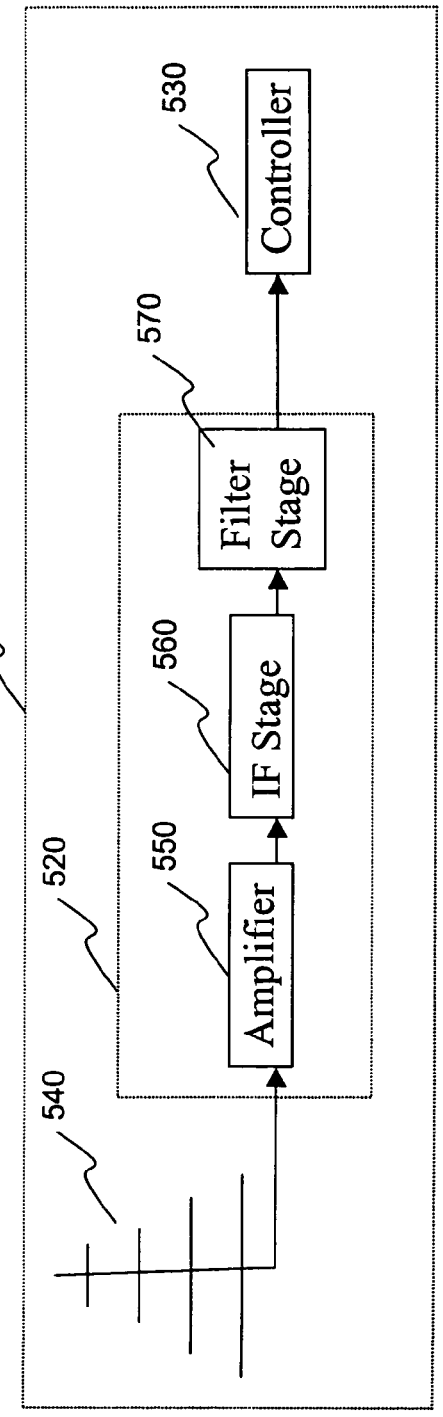
FIG. 11 is a simplified block diagram of the receiver in the receiver node of the RF communication system of FIG. 10 in accordance with an exemplary embodiment of the present invention.

Referring to FIG. 11, an exemplary receive node 510 includes, by way of example, a radio receiver 520, a communications control system or controller 530, and an antenna 540. In an exemplary embodiment the antenna may be incorporated directly into the receiver 520. In one embodiment the communications controller 530 is, by way of example, a media access controller (MAC) operating in accordance with one or more standards, including but not limited to, IEEE 802.11, Bluetooth, advanced mobile phone services (AMPS), global systems for mobile communications (GSM), code division multiple access (CDMA), local multi-point distribution systems (LMDS), multi-channel-multi-point distribution systems (MMDS), and or variations thereof. In an exemplary embodiment the communications controller 530 is coupled to the radio receiver and is, by way of example, an integrated digital controller with a plurality of inputs and outputs, such as a transmit data output and a receive data input.

In the illustrated receiver node 510, the receiver 520 is coupled to the antennae 540 and includes a low noise amplifier 550, one or more intermediate frequency stages 560 and a filtering stage 570. In an exemplary embodiment, at least one of the one or more intermediate frequency stages includes the described exemplary passive mixer.

In the illustrated embodiment, the low noise amplifier 550 receives an inbound RF signal from the antennae and outputs an amplified received signal to the described exemplary passive mixer. The passive mixer mixes the amplified received RF signal with one or more local oscillator signals to convert the amplified received RF signal into a baseband signal or an intermediate frequency (IF) signal.

The filtering stage 570 then filters the IF or baseband signal to attenuate unwanted out of band signals to produce a filtered IF signal. The communications controller recovers raw data from the filtered IF signal in accordance with the particular communications standard in use.

The invention described herein will itself suggest to those skilled in the various arts, alternative embodiments and solutions to other tasks and adaptations for other applications. It is the applicant's intention to cover by claims all such uses of the invention and those changes and modifications that could be made to the embodiments of the invention herein chosen for the purpose of disclosure without departing from the spirit and scope of the invention.

What is claimed is:

1. A radio frequency (RF) circuit for receiving an input signal, and producing a differential mixer output signal using the input signal, the RF circuit comprising:
   a first plurality of transistors arranged in a ring configuration, each of the first plurality of transistors comprising a first electrode of a first type and a second electrode of a second type; and
   a second plurality of transistors, each of the second plurality of transistors comprising a first electrode of the second type and a second electrode of the first type,
   wherein the first electrode of the second type electrode of each of the second plurality of transistors is coupled to the first electrode of the first type of a different one of the first plurality of transistors and the second electrode of the second type of each of the second plurality of transistors is coupled to the second electrode of the first type of a different one of the first plurality of transistors,
   wherein the first and second plurality of transistors receive the input signal and a drive signal, and process the input signal and the drive signal to produce the differential mixer output signal having a frequency which is a function of frequency of the input signal and frequency of the drive signal,
   wherein the second plurality of transistors reduce a resistance of the first plurality of transistors,
   wherein the drive signal includes a local oscillator (LO) drive signal and a complementary LO drive signal, the RF circuit further comprising an LO buffer for producing the LO drive signal coupled to a control electrode of each of a first pair of the first plurality of transistors and each of a first pair of the second plurality of transistors and for producing the complementary LO drive signal coupled to a control electrode of each of a second pair of the first plurality of transistors and each of a second pair of the plurality of transistors,
   wherein the LO buffer comprises a high swing inductively loaded LO buffer,
   wherein the LO buffer comprises a differential pair of LO buffer transistors, each coupled between a positive voltage source and ground through an inductive load, coupled between a positive voltage source and ground, and
   wherein the LO buffer further comprises a plurality of LO buffer outputs and a LO buffer voltage limiter coupled to the LO buffer outputs, the LO buffer voltage limiter limiting a common mode voltage of the LO drive signal arid the complementary LO drive signal.

2. The RF circuit of claim 1, wherein the first plurality of transistors are of a first transistor type and the second plurality of transistors are of a second transistor type.

3. The RF circuit of claim 1, wherein the resistance of the first plurality of transistors reduced by the second plurality of transistors comprises an on resistance of the first plurality of transistors.

4. The RF circuit of claim 1, wherein the first plurality of transistors comprise a first resistance and the second plurality of transistors comprise a second resistance and wherein, when the first resistance is increased, the second resistance is decreased.

5. The RF circuit of claim 1, wherein each of the first plurality of transistors comprise a first aspect ratio, wherein each of the second plurality of transistors comprises a second aspect ratio, and wherein the first aspect ratio and the second aspect ratio are different.

6. The RF circuit of claim 4, wherein the second aspect ratio is larger than the first aspect ratio.

7. The RE circuit of claim 5, wherein the second aspect ratio is about 3 to 5 times larger than the first aspect ratio.

8. The RF circuit of claim 1, wherein the first plurality of transistors comprise n-type transistors.

9. The RF circuit of claim 8, wherein the second plurality of transistors comprise p-type transistors.

10. The RF circuit of claim 1, wherein the first plurality of transistors comprise NMOS transistors.

11. The RF circuit of claim 10, wherein the second plurality of transistors comprise PMOS transistors.

12. The RF circuit of claim 1, wherein the first pair of the first plurality of transistors is coupled to the second pair of the second plurality of transistors and wherein the second pair of the first plurality of transistors is coupled to the first pair of the second plurality of transistors.

13. The RF circuit of claim 1, wherein the differential pair of inductively loaded LO buffer transistors comprise n-type transistors.

14. The RF circuit of claim 1, wherein the LO buffer further comprises a LO buffer bias circuit coupled to gate electrodes of the differential pair of inductively loaded LO buffer transistors.

15. The RF circuit of claim 14, wherein the LO buffer bias circuit comprises LO buffer bias resistors and an LO buffer voltage source coupled to the gates of the differential pair of inductively loaded LO buffer transistors.

16. A radio frequency (RF) circuit for receiving an input signal, and producing a differential mixer output signal using the input signal, the RF circuit comprising:
   a first plurality of transistors arranged in a ring configuration, each of the first plurality of transistors comprising a first electrode of a first type and a second electrode of a second type; and
   a second plurality of transistors, each of the second plurality of transistors comprising a first electrode of the second type and a second electrode of the first type,
   wherein the first electrode of the second type electrode of each of the second plurality of transistors is coupled to the first electrode of the first type of a different one of the first plurality of transistors and the second electrode of the second type of each of the second plurality of transistors is coupled to the second electrode of the first type of a different one of the first plurality of transistors,
   wherein the first and second plurality of transistors receive the input signal and a drive signal, and process the input signal and the drive signal to produce the differential mixer output signal having a frequency which is a function of frequency of the input signal and frequency of the drive signal,
   wherein the second plurality of transistors reduce a resistance of the first plurality of transistors,
   wherein the drive signal includes a local oscillator (LO) drive signal and a complementary LO drive signal, the RF circuit further comprising an LO buffer for producing the LO drive signal coupled to a control electrode of each of a first pair of the first plurality of transistors and each of a first pair of the second plurality of transistors and for producing the complementary LO drive signal coupled to a control electrode of each of a second pair of the first plurality of transistors and each of a second pair of the plurality of transistors,
   wherein the LO buffer comprises a high swing inductively loaded LO buffer,
   wherein the LO buffer comprises a differential pair of LO buffer transistors, each coupled between a positive voltage source and ground through an inductive load, and
   wherein the LO buffer further comprises an impedance coupled between the positive voltage source and the inductively loaded LO buffer transistors to limit common mode voltage of the LO drive signal and the complementary LO drive signal.

17. A radio frequency (RF) circuit for receiving an input signal, and producing a differential mixer output signal using the input signal, the RF circuit comprising:
   means for arranging a first plurality of transistors in a ring configuration; and
   means for coupling each of a second plurality of transistors to a different one of the first plurality of transistors,
   wherein the first and second plurality of transistors receive the input signal and a drive signal, and process the input signal and the drive signal to produce the differential mixer output signal having a frequency which is a function of frequency of the input signal and frequency of the drive signal,
   wherein the second plurality of transistors reduce a resistance of the first plurality of transistors,
   wherein the drive signal includes a local oscillator (LO) drive signal and a complementary LO drive signal, the RF circuit further comprising an LO buffer for producing the LO drive signal coupled to a control electrode of each of a first pair of the first plurality of transistors and each of a first pair of the second plurality of transistors and for producing the complementary LO drive signal coupled to a control electrode of each of a second pair of the first plurality of transistors and each of a second pair of the plurality of transistors,
   wherein the LO buffer comprises a high swing inductively loaded LO buffer,
   wherein the LO buffer comprises a differential pair of LO buffer transistors, each coupled between a positive voltage source and ground through an inductive load, and
   wherein the LO buffer further comprises an impedance coupled between the positive voltage source and the inductively loaded LO buffer transistors to limit common mode voltage of the LO drive signal and the complementary LO drive signal.

18. The RF circuit of claim 17, wherein the first plurality of transistors are of a first transistor type and the second plurality of transistors are of a second transistor type.

* * * * *